United States Patent
Zhu et al.

(10) Patent No.: US 9,634,662 B2
(45) Date of Patent: Apr. 25, 2017

(54) HIGH-VOLTAGE-TOLERANT PULL-UP RESISTOR CIRCUIT

(71) Applicant: Semiconductor Manufacturing International (Shanghai) Corporation, Shanghai (CN)

(72) Inventors: Kai Zhu, Shanghai (CN); Jie Chen, Shanghai (CN); Wenjun Weng, Shanghai (CN); Shanyue Mo, Shanghai (CN); Zhiguang Guo, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/547,319

(22) Filed: Nov. 19, 2014

(65) Prior Publication Data

US 2015/0137881 A1  May 21, 2015

(30) Foreign Application Priority Data

Nov. 19, 2013 (CN) .......................... 2013 1 0582609

(51) Int. Cl.
*H03K 19/003* (2006.01)
*H03K 19/0185* (2006.01)

(52) U.S. Cl.
CPC ................. *H03K 19/00315* (2013.01); *H03K 19/018507* (2013.01)

(58) Field of Classification Search
CPC ................. H03K 17/08; H03K 17/081; H03K 17/08104; H03K 17/10; H03K 17/102; H03K 17/12; H03K 17/122
See application file for complete search history.

(56) References Cited

U.S. PATENT DOCUMENTS

| | | | | |
|---|---|---|---|---|
| 4,833,342 A | * | 5/1989 | Kiryu ....................... | G05F 3/247 323/313 |
| 5,430,633 A | * | 7/1995 | Smith ................ | H02M 3/33569 363/131 |
| 5,493,244 A | * | 2/1996 | Pathak ............. | H03K 17/08142 327/313 |
| 5,555,149 A | * | 9/1996 | Wert .................. | H03K 17/0822 361/18 |
| 5,748,011 A | * | 5/1998 | Takahashi ........ | H03K 19/00315 326/81 |

(Continued)

*Primary Examiner* — Thomas J Hiltunen
(74) *Attorney, Agent, or Firm* — Anova Law Group, PLLC

(57) ABSTRACT

A pull-up resistor circuit is provided for an IC, including a voltage source, a voltage output for providing a first voltage to supply power for providing a second voltage for an input/output (I/O) port of the IC, a first PMOS transistor, a second PMOS transistor and a control signal generator. The first PMOS transistor and the second PMOS transistor are connected in series to provide pull-up resistance, where the first PMOS transistor is coupled to a first control signal to control a pull-up function of the pull-up resistor circuit in a normal mode. Further, the control signal generator is for generating a second control signal coupled to the second PMOS transistor to control a bias voltage of the pull-up resistor circuit to prevent a reverse current from the voltage output to the voltage source under a high-voltage-tolerant mode when the second voltage is higher than the first voltage.

20 Claims, 4 Drawing Sheets

(56) References Cited

U.S. PATENT DOCUMENTS

| | | | | | |
|---|---|---|---|---|---|
| 5,751,142 | A | * | 5/1998 | Dosho | G05F 3/247 |
| | | | | | 323/314 |
| 5,898,235 | A | * | 4/1999 | McClure | G11C 5/147 |
| | | | | | 307/64 |
| 5,963,055 | A | * | 10/1999 | Tanaka | H03K 19/00315 |
| | | | | | 326/81 |
| 6,147,513 | A | * | 11/2000 | Bui | H03K 19/0027 |
| | | | | | 326/83 |
| 6,194,920 | B1 | * | 2/2001 | Oguri | H03F 3/303 |
| | | | | | 327/563 |
| 6,236,235 | B1 | * | 5/2001 | Arai | H03K 19/00315 |
| | | | | | 326/57 |
| 6,320,414 | B1 | * | 11/2001 | Annema | H03K 17/08142 |
| | | | | | 326/80 |
| 6,326,835 | B1 | * | 12/2001 | Kawano | G05F 1/575 |
| | | | | | 327/534 |
| 6,400,191 | B2 | * | 6/2002 | Kawano | H03K 19/018521 |
| | | | | | 326/81 |
| 6,586,799 | B1 | * | 7/2003 | Terashima | H01L 21/266 |
| | | | | | 257/329 |
| 6,628,149 | B2 | * | 9/2003 | Ajit | G11O 5/14 |
| | | | | | 326/81 |
| 6,803,789 | B1 | * | 10/2004 | Yu | H03K 19/00315 |
| | | | | | 326/27 |
| 7,027,275 | B2 | * | 4/2006 | Smith | H01L 27/0251 |
| | | | | | 327/374 |
| 7,675,329 | B2 | * | 3/2010 | Kiuchi | H03F 1/52 |
| | | | | | 327/108 |
| 8,860,472 | B2 | * | 10/2014 | Yuan | H03K 17/063 |
| | | | | | 327/109 |
| 9,160,403 | B2 | * | 10/2015 | Suzuki | H04B 3/02 |

\* cited by examiner

HIGH-VOLTAGE-TOLERANT PULL-UP RESISTOR CIRCUIT

CROSS-REFERENCES TO RELATED APPLICATIONS

This application claims priority to Chinese Patent Application No. 201310582609.X, filed on Nov. 19, 2013, the entire contents of which are incorporated herein by reference.

FIELD OF THE DISCLOSURE

The present disclosure relates to the field of integrated circuit technology and, more particularly, relates to a pull-up resistor circuit in high-voltage-tolerant applications.

BACKGROUND

Pull-up resistor circuit is widely used in integrated circuits (IC), especially in the input/output (I/O) circuits. Many I/O ports typically need to be set to a default high level voltage, so that when there is no input signal, an I/O port is pulled up to the high voltage level by a pull-up resistor.

FIG. 1 shows a traditional pull-up resistor circuit of an IC circuit. As shown in FIG. 1, the pull-up resistor circuit includes a voltage source VDD, a voltage output OUT, and a PMOS transistor MP0. The source and the substrate of the PMOS transistor MP0 are connected to the voltage source VDD. The drain of the PMOS transistor MP0 is connected to voltage output OUT. The control signal RE is inputted through the gate of the PMOS transistor MP0. The voltage source VDD is connected to the power supply, and the voltage output OUT is connected to an I/O port of the IC circuit.

Under a normal mode, where a voltage of the voltage source VDD is higher than that of the voltage output OUT, when the control signal RE is low, the PMOS transistor MP0 is turned on and the resistor is enabled, therefore, the voltage on the voltage output OUT is pulled up to the same voltage level as the voltage source VDD and have the same voltage level. When the control signal RE is high, the PMOS transistor MP0 is turned off and the resistor pull-up is disabled.

However, under a high-voltage-tolerant mode, where the voltage of the voltage output OUT is higher than that of the voltage source VDD (for example, when the voltage source VDD is at 3.3V, while the voltage on the bus is 5V and the voltage output OUT is connected to the bus), even though the control signal RE is high, the PMOS transistor MP0 is still turned on. Thus, the current flows from the voltage output OUT to the voltage source VDD.

The disclosed device structures and methods are directed to solve one or more problems set forth above and other problems.

BRIEF SUMMARY OF THE DISCLOSURE

One aspect of the present disclosure includes a pull-up resistor circuit provided for an IC. The pull-up resistor circuit includes a voltage source, a voltage output for providing a first voltage to supply power for providing a second voltage for an input/output (I/O) port of the IC, a first PMOS transistor, a second PMOS transistor and a control signal generator. The first PMOS transistor and the second PMOS transistor are connected in series to provide pull-up resistance, where the first PMOS transistor is coupled to a first control signal to control a pull-up function of the pull-up resistor circuit in a normal mode. Further, the control signal generator is for generating a second control signal coupled to the second PMOS transistor to control a bias voltage of the pull-up resistor circuit to prevent a reverse current from the voltage output to the voltage source under a high-voltage-tolerant mode when the second voltage is higher than the first voltage.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The existing pull-up resistor circuitry often generates reverse current from the voltage output to the voltage source under the high-voltage-tolerant mode. The reverse current can elevate the voltage of the voltage source, affecting the reliability of entire integrated circuit powered by the voltage source.

Figure 1:
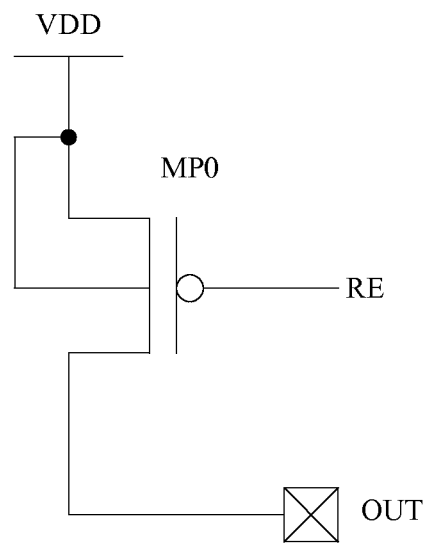
FIG. 1 illustrates an existing pull-up resistor circuit.
Figure 2:
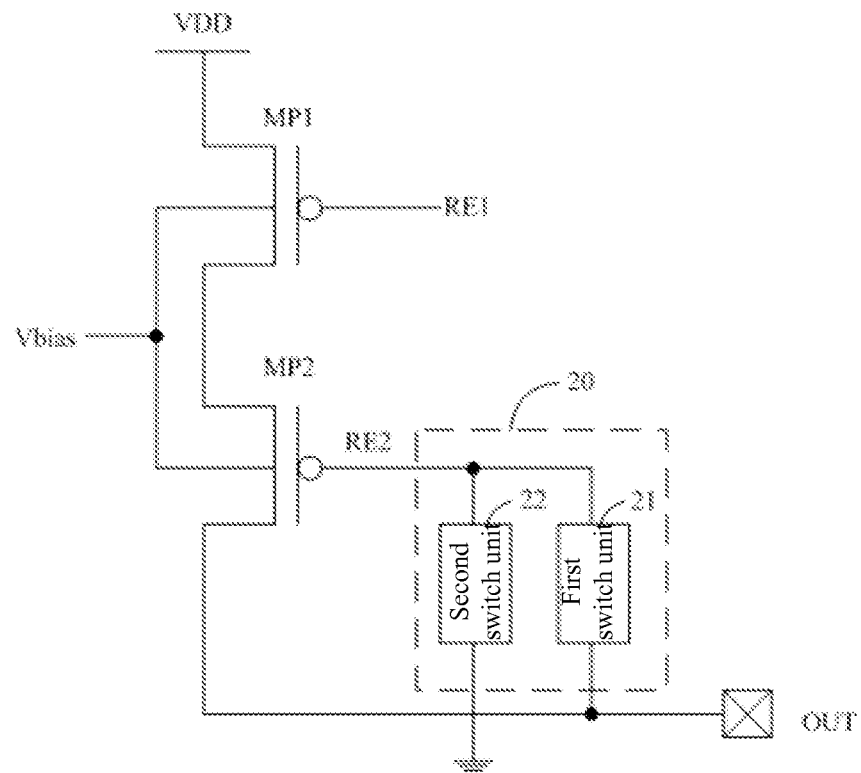
FIG. 2 illustrates exemplary pull-up resistor circuit consistent with the disclosed embodiments.

FIG. 2 illustrates an exemplary pull-up resistor circuit consistent with the disclosed embodiments. As shown in FIG. 2, the disclosed pull-up resistor circuit includes a voltage source VDD, a voltage output OUT, a first PMOS transistor MP1, a second PMOS transistor MP2, and a control signal generator 20. Although PMOS transistors are used as an example, other types of the transistors may also be used.

The voltage source VDD may be used to input a power supply voltage, i.e., the voltage source VDD may be connected to a power supply. The pull-up resistor circuit may be used in an input/output (I/O) circuitry of an IC, and the voltage output OUT may be connected to an I/O port of the IC.

A first control signal RE1 is connected to or applied on the gate of first PMOS transistor MP1, and the first control signal RE1 is a pull-up control signal. The source of the first PMOS transistor MP1 is connected to the voltage source VDD, and the drain of the first PMOS transistor MP1 is connected to the source of the second PMOS transistor MP2. The substrate of the first PMOS transistor MP1 and the substrate of the second PMOS transistor MP2 are connected and applied with an input bias voltage Vbias. To certain extent, the pull-up resistor comprises serially connected first PMOS transistor MP1 and second PMOS transistor MP2.

The value of the bias voltage Vbias is equal to the higher of the voltage of the voltage source VDD and the voltage output OUT. That is, when the voltage of the voltage source VDD is greater than the voltage of the voltage output OUT, the bias voltage Vbias is equal to the voltage of the voltage source VDD; when the voltage of the voltage output OUT is greater than the voltage of the voltage source VDD, the bias voltage Vbias is equal to the voltage of the voltage output OUT.

A second control signal RE2 is connected to the gate of the second PMOS transistor MP2, and the drain of the second PMOS transistor MP2 is connected to the voltage output OUT.

The second control signal RE2 is generated by the control signal generator 20, and the state of the second control signal RE2 corresponds to the operating mode of the pull-up resistor circuit. Two operating modes may be provided for the pull-up resistor circuit: a normal mode and a high-voltage-tolerant mode.

Under the normal mode, when the pull-up resistor circuit is in operation, the voltage of the voltage source VDD is higher than or equal to the voltage of the voltage output OUT. Under the high-voltage-tolerant mode, when the pull-up resistor circuit is in operation, the voltage of the voltage output OUT is higher than the voltage of the voltage source VDD. Also, under the high-voltage-tolerant mode, the voltage difference between the voltage of the voltage output OUT and the voltage of the voltage output VDD is greater than the threshold voltage of the PMOS transistors (e.g., the first PMOS transistor MP1 and second PMOS transistor MP2).

Under the normal mode and when the pull-up function of the pull-up resistor circuit is effective, the voltage of the voltage source VDD is higher than or equal to the voltage of the voltage output OUT and the first control signal RE1 is low, and the second control signal RE2 is low. Under the high-voltage-tolerant mode, the voltage of the voltage output OUT is higher than the voltage of the voltage source VDD, the value/amplitude of the second control signal RE2 is equal to the voltage of the voltage output OUT.

More specifically, under the normal mode, the voltage of the voltage source VDD is higher than or equal to the voltage of the voltage output OUT, and the bias voltage Vbias is equal to the voltage of the voltage source VDD. When the first control signal RE1 is low, the second control signal RE2 generated by the control signal generator 20 is low too. Therefore, both the first PMOS transistor MP1 and the second PMOS transistor MP2 are turned on, and the voltage of the voltage output OUT is equal to the voltage of the voltage source VDD. When the first control signal RE1 is high, the first PMOS transistor MP1 is turned off, and the pull-up function is not effective regardless of the state of the second control signal RE2.

Under the high-voltage-tolerant mode, the voltage of the voltage output OUT is higher than the voltage of the voltage source VDD, the bias voltage Vbias is equal to the voltage of the voltage output OUT, and the value/amplitude of the second control signal RE2 from the control signal generator 20 is equal to the voltage of the voltage output OUT. Thus, the voltage on the gate, the drain, and the substrate of the second PMOS transistor MP2 is the same as the voltage of the voltage output OUT. Regardless of the state of the first control signal RE1, the voltage difference between the gate and the drain of the second PMOS transistor MP2 is zero, and the voltage difference between the drain and the substrate of the second PMOS transistor MP2 is also zero. Thus, there is no current generated in the conductive channel of the second PMOS transistor MP2, the second PMOS transistor MP2 is turned off and there is no reverse current from the voltage output OUT to the voltage source VDD. The leakage current in the second PMOS transistor MP2 can also be prevented.

Thus, under the high-voltage-tolerant mode, regardless of the state of the first control signal RE1, the pull-up resistor circuit can prevent the generation of reverse current from the voltage output OUT to the voltage source VDD, improving the reliability of the IC.

Further, as shown in FIG. 2, the control signal generator 20 includes a first switch unit 21 and a second switch unit 22 to generate the second control signal RE2. The first switch unit 21 is connected between the gate of the second PMOS transistor MP2 and the voltage output OUT, and the second switch unit 22 is coupled between the gate of the second PMOS transistor MP2 and the ground. The impedance of the second switch unit 22 when turned on is larger than the impedance of the first switch unit 21 when turned on.

Specifically, one end of the first switch unit 21 is connected to one end of the second switch unit 22 for producing the second control signal RE2 generated by the control signal generator 20. The other end of the first switch unit 21 is connected to the voltage output OUT, and the other end of the second switch unit 22 is connected to the ground.

When the voltage of the voltage source VDD is higher than or equal to the voltage of the voltage output OUT, and the first control signal RE1 is low, the first switch unit 21 is turned off. When the voltage of the voltage source VDD is lower than that of the voltage output OUT, the first switch unit 21 is turned on. When the voltage of the voltage source VDD is higher than the voltage of the voltage output OUT and the first control signal RE1 is low, the second switch unit 22 is turned on.

Figure 3:
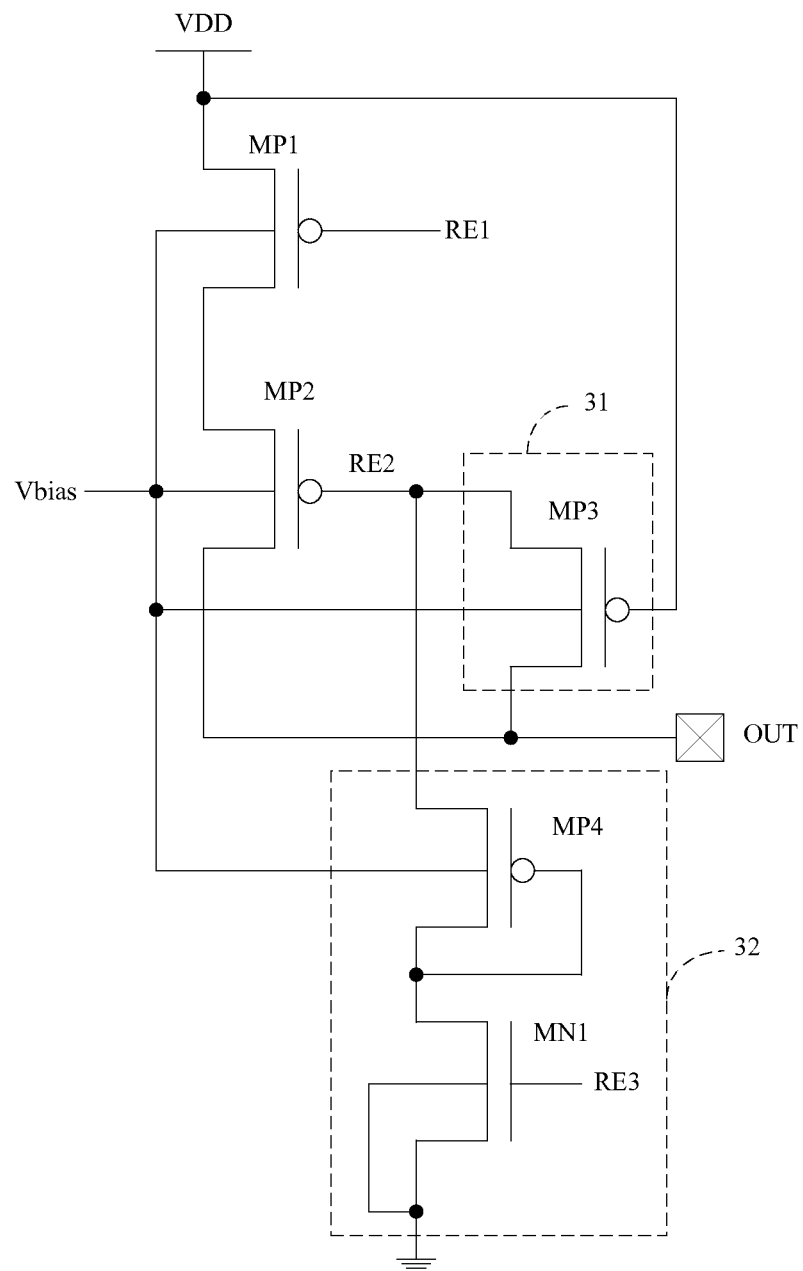
FIG. 3 illustrates a circuit diagram of an exemplary pull-up resistor circuit consistent with the disclosed embodiments.

The control signal generator 20 (e.g., the first switch unit 21, the second switch unit 22) may be implemented in any appropriate structures. FIG. 3 illustrates an exemplary pull-up resistor circuit with an exemplary control signal generator.

As shown in FIG. 3, the pull-up resistor circuit includes a voltage source VDD, a voltage output OUT, a first PMOS transistor MP1, a second PMOS transistor MP2, and a control signal generator (not labeled). Other components may also be included.

The voltage source VDD, the voltage output OUT, the first PMOS transistor MP1, and the second PMOS transistor MP2 may be similar to those shown in FIG. 2, the details of which are omitted herein. Further, the control signal generator includes a first switch unit 31 and a second switch unit 32.

The first switch unit 31 includes a third PMOS transistor MP3, and the second switch unit 32 includes a fourth PMOS transistor MP4 and a first NMOS transistor MN1. The impedance of the first switch unit 31 when turned on is smaller than the impedance of the second switch unit 32 when turned on. Thus, when both the first switch unit 31 and the second switch unit 32 are turned on, the second control signal RE2 generated by the control signal generator is the signal transmitted through the first switch unit 31. The PMOS transistor and the NMOS transistor are used for illustrative purposes, any appropriate type of transistors may be used.

When both the first switch unit 31 and the second switch 32 are MOS transistors, the turned-on impedance of the first switch unit 31 is related to the width-to-length ratio of the third PMOS transistor MP3, and the turned-on impedance of the second switch unit 32 is related to the width-to-length ratio of the fourth PMOS transistor MP4 and the width-to-length ratio of the first NMOS transistor MN1.

More specifically, the gate of the third PMOS transistor MP3 is connected to the voltage source VDD. The source of the third PMOS transistor MP3 is connected to the gate of the second PMOS transistor MP2. The drain of the third PMOS transistor MP3 is connected to the voltage output OUT, and the substrate of the third PMOS transistor MP3 and the substrate of the fourth PMOS transistor MP4 are connected together and are applied with the bias voltage Vbias. The value of the bias voltage Vbias is equal to the larger of the voltage of the voltage source VDD and the voltage of the voltage output OUT.

The gate of the fourth PMOS transistor MP4 is connected to the drain of the fourth PMOS transistor MP4 and the drain of the first NMOS transistor MN1, and the source of the fourth PMOS transistor MP4 is connected to the gate of the second PMOS transistor MP2. The third control signal RE3 is inputted through the gate of the first NMOS transistor MN1, and the source of the first NMOS transistor MN1 and the substrate of the first NMOS transistor MN1 are connected to the ground.

Further, the voltage/signal level of the third control signal RE3 is opposite to the voltage/signal level of the first control signal RE1. That it, when the first control signal RE1 is low, the third control signal RE3 is high, and when the first control signal RE1 is high, the third control signal RE3 is low.

Under the normal mode, the voltage of the voltage source VDD is higher than or equal to the voltage of the voltage output OUT, and the bias voltage Vbias is equal to the voltage of the voltage source VDD. Because the gate voltage of the third PMOS transistor MP3 is equal to the voltage of the voltage source VDD, and the drain voltage of the third PMOS transistor MP3 is equal to the voltage of the voltage output OUT, the third PMOS transistor MP3 is turned off, i.e., the first switch unit 31 is turned off.

When the first control signal RE1 is low, the third control signal RE3 is high. Thus, the first NMOS transistor MN1 is turned on, and the drain of the fourth PMOS transistor MP4 is pulled to low, and the fourth PMOS transistor MP4 is turned on. As both the first NMOS transistor MN1 and the fourth PMOS transistor MP4 are turned on, the second switch unit 32 is turned on, and the gate of the second PMOS transistor MP2 is pulled to low.

Thus, under the normal mode, when the first control signal RE1 is low, the second control signal RE2 is low too. The first PMOS transistor MP1 and the second PMOS transistor MP2 are both turned on, and the voltage of the voltage output OUT is pulled to the same value of the voltage of the voltage source VDD. When the first control signal RE1 is high, the first PMOS transistor MP1 is turned off, and the pull-up function is disabled regardless of the state of the second control signal RE2. In other words, the first control signal RE1 is thus acted as a disable signal.

Under the high-voltage-tolerant mode, the voltage of the voltage output OUT is higher than the voltage of the voltage source VDD, and bias voltage Vbias is equal to the voltage of the voltage output OUT. Because the gate voltage of the third PMOS transistor MP3 is equal to the voltage of the voltage source VDD, the drain voltage of the third PMOS transistor MP3 is equal to the voltage of the voltage output OUT, and the voltage of the voltage source VDD is lower than the voltage of the voltage output OUT, the third PMOS transistor MP3 is turned on, and the first switch unit 31 is turned on.

Because the turned-on impedance of the first switch unit 31 is lower than the turned-on impedance of the second switch unit 32, when the first switch unit 31 is turned on, no matter whether the second switch unit 32 is turned on or off, the gate voltage of the second PMOS transistor MP2 is pulled to the same level as the voltage of the voltage output OUT by the first switch unit 31. That is, the second control signal RE2 from the control signal generator is equal to the voltage of the voltage output OUT.

Because the bias voltage Vbias is equal to the voltage of the voltage output OUT, the voltage on the gate, the drain, and the substrate of the second PMOS transistor MP2 is the same as the voltage of the voltage output OUT. Thus, regardless of the state of the first control signal RE1, the voltage difference between the gate and the drain of the second PMOS transistor MP2 and the voltage difference between the substrate and the drain of the second PMOS transistor MP2 are all zero. There is no current generated in the conductive channel of the second PMOS transistor MP2, and the second PMOS transistor MP2 is turned off. Thus, there is no reverse current generated from the voltage output OUT to the voltage source VDD.

Further, under the high-voltage-tolerant mode, if the third control signal RE3 is low, the first NMOS transistor MN1 is turned off, and the fourth PMOS transistor MP4 is turned on. The drain voltage of the first NMOS transistor MN1 is close to the voltage of the voltage output OUT, and the source voltage of the first NMOS transistor MN1 is at the ground level. Thus, a substantially high voltage difference exists between the drain and the source of the first NMOS transistor MN1. However, because there is no current flow through the first NMOS transistor MN1, the reliability of the first NMOS transistor MN1 can be ensured.

When the third control signal RE3 is high, the fourth PMOS transistor MP4 and the first NMOS transistor MN1 are both turned on. By splitting the total voltage by the fourth PMOS transistor MP4 and the first NMOS transistor MN1, the voltage difference between the drain and the source of the fourth PMOS transistor MP4 and the voltage difference between the drain and the source of the first NMOS transistor MN1 are all close to half of the voltage of the voltage output OUT, which enables both the fourth PMOS transistor MP4 and the first NMOS transistor MN1 to operate within normal operating voltage range, improving the reliability of the fourth PMOS transistor MP4 and the first NMOS transistor MN1.

Thus, the first PMOS transistor MP1 is configured to control the pull up function and the second PMOS transistor MP2 is configured to prevent leakage current. At the same time, the bias voltage signal is generated by a bias circuit setup to control the pull-up resistor circuit, i.e., to control which transistor is biased by the bias voltage Vbias.

Figure 4:
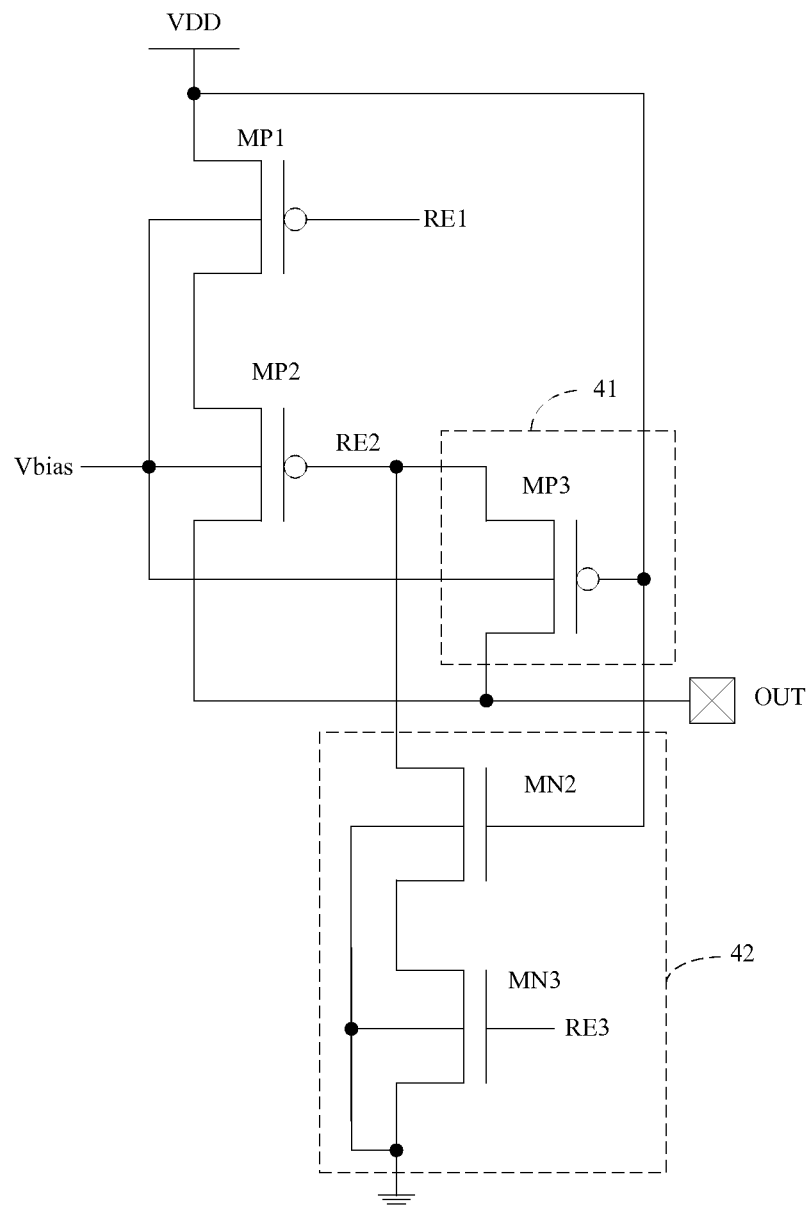
FIG. 4 illustrates a circuit diagram of another exemplary pull-up resistor circuit consistent with the disclosed embodiments.

FIG. 4 illustrates another exemplary pull-up resistor circuit with another exemplary control signal generator. As shown in FIG. 4, the pull-up resistor circuit includes a voltage source VDD, a voltage output OUT, a first PMOS transistor MP1, a second PMOS transistor MP2, and a control signal generator. Other components may also be included.

The voltage source VDD, the voltage output OUT, the first PMOS transistor MP1, and the second PMOS transistor MP2 may be similar to those shown in FIG. 2, the details of which are omitted herein. Further, the control signal generator includes a first switch unit 41 and a second switch unit 42.

The turned-on impedance (i.e., the impedance when the switch unit is turned on) of the first switch unit 41 is smaller than the turned-on impedance of the second switch 42. The first switch unit 41 includes a third PMOS transistor MP3, which may be similar to the third PMOS transistor MP3 described above.

The second switch unit 42 includes a second NMOS transistor MN2 and a third NMOS transistor MN3. More specifically, the gate of the second NMOS transistor MN2 is connected to the voltage source VDD, the drain of the second NMOS transistor MN2 is connected to the gate of the second PMOS transistor MP2, the source of the second NMOS transistor MN2 is connected to the drain of the third NMOS transistor MN3, and both substrates of the second NMOS transistor MN2 and the third NMOS transistor MN3 are connected together to the ground. Further, the third control signal RE3 is inputted on the gate of the third NMOS transistor MN3, and the source of the third NMOS transistor MN3 is connected to the ground.

Further, the voltage/signal level of the third control signal RE3 is opposite to the voltage/signal level of the first control signal RE1. That it, when the first control signal RE1 is low, the third control signal RE3 is high, and when the first control signal RE1 is high, the third control signal RE3 is low.

Under the normal mode, the third PMOS transistor MP3 is turned off. When the first control signal RE1 is low, the third control signal RE3 is high, and both the second NMOS transistor MN2 and the third NMOS transistor MN3 are turned on. At the same time, the second control signal RE2 generated from the disclosed control signal generator is low, and the first PMOS transistor MP1 and the second PMOS transistor MP2 are both turned on. The voltage of the voltage output OUT is pulled up to the same value as the voltage of the voltage source VDD. When the first control signal RE1 is high, the first PMOS transistor MP1 is turned off, and the pull-up function is no-longer effective.

Under the high-voltage-tolerant mode, the third PMOS transistor MP3 is turned on, and the voltage on the gate, the drain, and the substrate of the second PMOS transistor MP2 have the same voltage as the voltage of the voltage output OUT. There is no current in the conductive channel of the second PMOS transistor MP2, and the second PMOS transistor MP2 is turned off. There is no reverse current generated from the voltage output OUT to the voltage source VDD.

Under the high-voltage-tolerant mode, when the third control signal RE3 is low, the second NMOS transistor MN2 is turned on, and the third NMOS transistor MN3 is turned off. The drain voltage of the third NMOS transistor MN3 is (Vdd−Vth), where Vdd is the voltage of the voltage source VDD, and Vth is the threshold voltage of the second NMOS transistor MN2. Therefore, the reliability of the second NMOS transistor MN2 and the third NMOS transistor MN3 can be ensured.

When the third control signal RE3 is high, both the second NMOS transistor MN2 and the third NMOS transistor MN3 are turned on. By splitting the total voltage by the second NMOS transistor MN2 and the third NMOS transistor MN3, the voltage difference between the drain and the source of the second NMOS transistor MN2 and the voltage difference between the drain and the source of the third NMOS transistor MN3 are both close to half of the voltage of the voltage output OUT. Therefore, both the fourth PMOS transistor MP4 and the first NMOS transistor MN1 are operating within a normal operating range, improving the reliability of the second NMOS transistor MN2 and the third NMOS transistor MN3.

Figure 5:
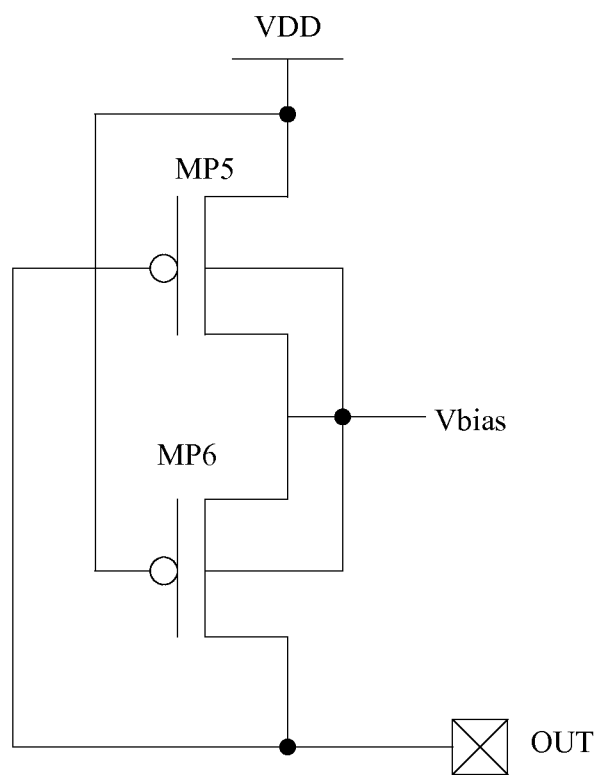
FIG. 5 illustrates a circuit diagram of an exemplary bias voltage generation circuitry consistent with the disclosed embodiments.

FIG. 5 illustrates an exemplary bias voltage generating circuit. As shown in FIG. 5, the bias voltage generator includes a fifth PMOS transistor MP5 and a sixth PMOS transistor MP6. The voltage source VDD and the voltage output OUT are similar to those described above.

The gate of the fifth PMOS transistor MP5 is connected to the drain of the sixth PMOS transistor MP6 and the voltage output OUT, and the source of the fifth PMOS transistor MP5 is connected to the voltage source VDD and the gate of the sixth PMOS transistor MP6. At the same time, the drain of the fifth PMOS transistor MP5 is connected to the source of the sixth PMOS transistor MP6, the substrate of the fifth PMOS transistor MP5 and the substrate of the sixth PMOS transistor MP6 are connected together to output a bias voltage Vbias.

When the voltage of the voltage source VDD is higher than or equal to the voltage of the voltage output OUT, the fifth PMOS transistor MP5 is turned on, and the drain voltage of MP5 is equal to the voltage of the voltage source VDD. The bias voltage generated by the disclosed bias voltage generator is equal to the voltage of the voltage source VDD.

When the voltage of the voltage output OUT is higher than the voltage of the voltage source VDD, the sixth PMOS transistor MP6 is turned on, and the source voltage of the sixth PMOS transistor MP6 is equal to the voltage of the voltage output OUT. The bias voltage Vbias from the bias voltage generator is equal to the voltage of the voltage output OUT. Such bias voltage generator may be used in various pull-up resistor circuitry consistent with the disclosed embodiments.

By using the disclosed methods and systems, a normal mode and a high-voltage-tolerant mode can be implemented in pull-up resistor circuitry. Under the normal mode, the pull-up function can be performed normally, and under the high-voltage-tolerant mode, the pull-up resistor circuit can prevent the generation of reverse current from the voltage output to the voltage source, improving the reliability of the IC.

Other applications, advantages, alternations, modifications, or equivalents to the disclosed embodiments are obvious to those skilled in the art.

What is claimed is:

1. A pull-up resistor circuit for an IC, comprising:
a voltage source for providing a source voltage to supply-power;
a voltage output for providing an output voltage for an input/output (I/O) port of the IC;
a first PMOS transistor and a second PMOS transistor connected in serial to provide a pull-up resistance, wherein the first PMOS transistor is coupled to a first control signal to control a pull-up function of the pull-up resistor circuit in a normal mode when the source voltage is higher than the output voltage; and
a control signal generator for generating a second control signal coupled to the second PMOS transistor to control a bias voltage connected to a substrate of the second PMOS transistor and a substrate of the first PMOS transistor to prevent a reverse current from the voltage output to the voltage source under a high-voltage-tolerant mode regardless of a logic level of the first control signal when the output voltage is higher than the source voltage, a value of the bias voltage being a greater of the source voltage and the output voltage, wherein:
the control signal generator includes a first switch unit including a third PMOS transistor having a width-to-length ratio related to an impedance of the first switch unit, and a second switch unit including a fourth PMOS transistor and a first NMOS transistor, a gate of the fourth PMOS transistor is connected to a drain of the fourth PMOS transistor and connected to a drain of the first NMOS transistor, a source of the fourth PMOS transistor is connected to the gate of the second PMOS transistor, a turn-on impedance of the second switch unit being higher than a turn-on impedance of the first switch unit, a gate of the first NMOS transistor is inputted with a third control signal and a signal level of the third control signal is always opposite to a signal level of the first control signal.

2. The pull-up resistor circuit according to claim 1, wherein:
the first control signal is inputted on a gate of the first PMOS transistor;
a source of the first PMOS transistor is connected to the voltage source; and
a drain of the first PMOS transistor is connected to a source of the second PMOS transistor.

3. The pull-up resistor circuit according to claim 2, wherein:
the second control signal is applied on a gate of the second PMOS transistor, and a drain of the second PMOS transistor is connected to the voltage output; and
when the source voltage is higher than or equal to the output voltage and the first control signal is low, the second control signal is low, and when the source voltage is lower than the output voltage, the second control signal is at a same level of the output voltage.

4. The pull-up resistor circuit according to claim 1, wherein:
the first switch unit is connected between the gate of the second PMOS transistor and the voltage output; and
the second switch unit is connected between the gate of the second PMOS transistor and ground.

5. The pull-up resistor circuit according to claim 4, wherein:
when the source voltage is higher than or equal to the output voltage and the first control signal is low, the first switch unit is turned off;
when the source voltage is lower than the output voltage, the first switch unit is turned on; and
when the source voltage is higher than or equal to the output voltage and the first control signal is low, the second switch unit is turned on.

6. The pull-up resistor circuit according to claim 5, wherein:
a gate of the third PMOS transistor is connected to the voltage source;
a source of the third PMOS transistor is connected to the gate of the second PMOS transistor;
a drain of the third PMOS transistor is connected to the voltage output; and
a substrate of the third PMOS transistor is applied with the bias voltage.

7. The pull-up resistor circuit according to claim 6, wherein:
a substrate of the fourth PMOS transistor is used to apply the bias voltage;
and
a source of the first NMOS transistor and a substrate of the first NMOS transistor are connected to ground.

8. The pull-up resistor circuit according to claim 6, wherein:
a gate of the third PMOS transistor is connected to the voltage source;
a source of the third PMOS transistor is connected to the gate of the second PMOS transistor;
a drain of the third PMOS transistor is connected to the voltage output;
a substrate of the third PMOS transistor is connected to a substrate of the fourth PMOS transistor and applied with the bias voltage;
and
a source of the first NMOS transistor is connected to a substrate of the first NMOS transistor and to ground.

9. The pull-up resistor circuit according to claim 1, further including
a bias voltage generation circuit comprising a fifth PMOS transistor and a sixth PMOS transistor, wherein:
a gate of the fifth PMOS transistor is connected to a drain of the sixth PMOS transistor and to the voltage output;
a source of the fifth PMOS transistor is connected to a gate of the sixth PMOS transistor and to the voltage source;
a drain of the fifth PMOS transistor is connected to a source of the sixth PMOS transistor; and
a substrate of the fifth PMOS transistor is connected to a substrate of the sixth PMOS transistor and applied with the bias voltage.

10. A method for operating a pull-up resistor circuit for an IC, comprising:
providing a source voltage for supplying power;
providing a pull-up resistance by a first PMOS transistor and a second PMOS transistor connected in serial, wherein the first PMOS transistor is coupled to a first control signal to control a pull-up function of the pull-up resistor circuit in a normal mode when the source voltage is higher than an output voltage of the IC; and
generating a second control signal by a control signal generator coupled to the second PMOS transistor;
applying a bias voltage to connected substrates of the second PMOS transistor and the first PMOS transistor, to prevent the reverse current from the voltage output to the voltage source under a high-voltage-tolerant mode regardless of a logic level of the first control signal when the output voltage is higher than the source voltage, a value of the bias voltage being a greater of the source voltage and the output voltage, wherein:
the control signal generator includes a first switch unit including a third PMOS transistor having a width-to-length ratio related to an impedance of the first switch unit, and a second switch unit including a fourth PMOS transistor and a first NMOS transistor, a gate of the fourth PMOS transistor is connected to a drain of the fourth PMOS transistor and connected to a drain of the first NMOS transistor, and a source of the fourth PMOS transistor is connected to the gate of the second PMOS transistor, a turn-on impedance of the second switch unit being higher than a turn-on impedance of the first switch unit, a gate of the first NMOS transistor is inputted with a third control signal and a signal level of the third control signal is always opposite to a signal level of the first control signal.

11. The method according to claim 10, wherein:
the first control signal is inputted on a gate of the first PMOS transistor; a source of the first PMOS transistor is connected to the voltage source; and
a drain of the first PMOS transistor is connected to a source of the second PMOS transistor.

12. The method according to claim 11, wherein:
the second control signal is applied on a gate of the second PMOS transistor, and a drain of the second PMOS transistor is connected to the voltage output; and when the source voltage is higher than or equal to the output voltage and the first control signal is low, the second control signal is low, and when the source voltage is lower than the output voltage, the second control signal is at a same level of the output voltage.

13. The method according to claim 10, wherein:
the first switch unit is connected between the gate of the second PMOS transistor and the voltage output; and
the second switch unit is connected between the gate of the second PMOS transistor and ground.

14. The method according to claim 13, wherein:
when the source voltage is higher than or equal to the output voltage and the first control signal is low, the first switch unit is turned off;
when the source voltage is lower than the output voltage, the first switch unit is turned on; and
when the source voltage is higher than or equal to the output voltage and the first control signal is low, the second switch unit is turned on.

15. The method according to claim 14, wherein:
a gate of the third PMOS transistor is connected to the voltage source;
a source of the third PMOS transistor is connected to the gate of the second PMOS transistor;
a drain of the third PMOS transistor is connected to the voltage output; and
a substrate of the third PMOS transistor is applied with the bias voltage.

16. The pull-up resistor circuit according to claim 15, wherein:
a substrate of the fourth PMOS transistor is used to apply the bias voltage;
and
a source of the first NMOS transistor and a substrate of the first NMOS transistor are connected to ground.

17. The pull-up resistor circuit according to claim 15, wherein:

a gate of the third PMOS transistor is connected to the voltage source;
a source of the third PMOS transistor is connected to the gate of the second PMOS transistor;
a drain of the third PMOS transistor is connected to the voltage output;
a substrate of the third PMOS transistor is connected to a substrate of the fourth PMOS transistor and applied with the bias voltage;
and
a source of the first NMOS transistor is connected to a substrate of the first NMOS transistor and to ground.

18. The method according to claim 10, further including:
a bias voltage generation circuit comprising a fifth PMOS transistor and a sixth PMOS transistor, wherein:
a gate of the fifth PMOS transistor is connected to a drain of the sixth PMOS transistor and to the output voltage;
a source of the fifth PMOS transistor is connected to a gate of the sixth PMOS transistor and to the voltage source;
a drain of the fifth PMOS transistor is connected to a source of the sixth PMOS transistor; and
a substrate of the fifth PMOS transistor is connected to a substrate of the sixth PMOS transistor and applied with the bias voltage.

19. The method according to claim 12, wherein when the bias voltage is equal to the output voltage, a voltage on the gate, the drain and the substrate of the second PMOS transistor is same as the output voltage.

20. The method according to claim 19, wherein regardless of the logic level of the first control signal, a voltage difference between the gate and the drain of the second PMOS transistor and a voltage difference between the substrate and the drain of the second PMOS transistor are zero so that no current is generated in a conductive channel of the second PMOS transistor and the second PMOS transistor is turned off.

* * * * *